United States Patent [19]
Teytu et al.

[11] Patent Number: 5,636,684
[45] Date of Patent: Jun. 10, 1997

[54] COOLING ELEMENT AND CONNECTOR FOR AN ELECTRONIC POWER COMPONENT COOLED BY A FLUID ELECTRICALLY ISOLATED FROM THE COMPONENT

[75] Inventors: André Teytu, Grenoble; Claude Godet, St. Martin d'Uriage, both of France

[73] Assignee: Atherm, Domene, France

[21] Appl. No.: 572,879

[22] Filed: Dec. 18, 1995

[30] Foreign Application Priority Data

Dec. 30, 1994 [FR] France ................... 94 16008

[51] Int. Cl.⁶ ................... F28F 7/02; F28F 21/04; F28F 23/02
[52] U.S. Cl. ................... 165/80.4; 165/168; 165/185; 361/699; 361/702
[58] Field of Search ................... 165/80.4, 104.19, 165/104.33, 168, 185, 80.5; 361/699, 702, 711, 713

[56] References Cited

U.S. PATENT DOCUMENTS

| | | | |
|---|---|---|---|
| 3,437,132 | 4/1969 | Venema | 165/185 X |
| 3,999,602 | 12/1976 | Fewell et al. | 165/185 X |
| 4,343,988 | 8/1982 | Roller et al. | 165/168 X |
| 4,583,583 | 4/1986 | Wittel | 165/46 |
| 4,620,507 | 11/1986 | Saito et al. | 165/168 X |
| 5,510,958 | 4/1996 | Shimabara et al. | 361/719 |

FOREIGN PATENT DOCUMENTS

| | | |
|---|---|---|
| 234021 | 9/1987 | European Pat. Off. . |
| 2523289 | 9/1983 | France . |
| 8801086 | 4/1988 | Germany . |
| 2117105 | 10/1983 | United Kingdom . |

*Primary Examiner*—Allen J. Flanigan
*Attorney, Agent, or Firm*—Oliff & Berridge

[57] ABSTRACT

A cooling element and connector comprises a metallic body formed by a good heat and electricity conducting material. Ceramic tubes are housed axially in orifices of the body, and are connected to manifolds for circulation of a cooling fluid. The tubes contain turbulating devices designed to channel the fluid according to a turbulent flow with a helicoidal trajectory. The heat exchange is optimum due to a metallic alloy with a low melting point inserted into the annular gaps arranged between the tubes and the corresponding orifices of the body. Assembly of the manifolds on the body is performed by means of screws inserted into the opposite ends of the turbulating devices.

10 Claims, 5 Drawing Sheets

COOLING ELEMENT AND CONNECTOR FOR AN ELECTRONIC POWER COMPONENT COOLED BY A FLUID ELECTRICALLY ISOLATED FROM THE COMPONENT

The invention relates to a cooling element comprising a body made of a good heat and electricity conducting metallic material, and forming a heat sink through which a cooling fluid flows, said body having a face supporting an electronic power component constituting the heat source.

An electronic power component, notably a thyristor or transistor for a solid-state converter, is generally formed by a disk, whose flat faces serve the purpose of removing the heat losses which may reach several hundred watts. The same faces of the component also ensure flow of the electrical current, the intensity of which may reach several thousand amperes.

It is therefore imperative for the cooling fluid not to be raised to the electrical potential of the faces of the component.

For this purpose, it has already been proposed to make use of a coolant fluid which is not an electricity conductor. This generally involves fluids of the chlorofluorocarbon type, or fluorocarbonated fluids the use of which is today either prohibited or strongly unadvised.

It has been proposed to perform cooling by means of a deionized water circuit the high resistivity of which ensures isolation of the cooling circuit. The drawback of this process is that it requires a regeneration device operating continuously to keep the resistivity of the water at a sufficient level.

Cooling devices entirely made of electrical insulating material have been proposed, but the electrical connections have to be achieved by copper plates interposed between the cooler and the electronic component. This solution, apart from its relative complexity at the time of assembly, presents the drawback of generating thermal contact resistances between the heat source and the cooler, which reduces the efficiency of the cooler.

A first object of the invention is to improve the heat exchange between the fluid and the body of the cooling element on which the component is mounted.

A second object of the invention is to strengthen the isolation of the fluid circuit with respect to the component.

The cooling element according to the invention is characterized in that the body comprises a plurality of orifices through which fluid circulation tubes pass axially, each tube having a diameter slightly smaller than that of the orifice, and being made of an insulating and good heat conducting material, and that the annular gap arranged between each tube and the corresponding orifice is filled by means of a metallic alloy, enabling an optimum heat exchange between the heat source and the cooling fluid, insertion of the alloy being performed via a filling orifice arranged in the body.

When it is cooled, the metallic alloy has the property of increasing in volume, which results in an expansion effect of the metal, so as to obtain a uniform intermediate layer, preventing any thermal contact resistance with the wall of the body over the whole length of the orifices.

The alloy forming this intermediate layer remains sufficiently soft after changing state to allow differential dilatations when temperature variations of the body occur.

According to a feature of the invention, the fluid circulation tubes are connected to a pair of manifolds adjoined to the opposite joining faces of the body, each manifold being made of an insulating material.

Each manifold is equipped along the first flat bearing face with a plurality of recesses to receive the opposite ends of the tubes, and with a common pipe making the tubes communicate respectively with an inlet nozzle and an outlet nozzle associated to a fluid distribution circuit.

According to another preferred feature of the invention, the material of the tube is made of ceramic, notably alumina or aluminium nitride. The metallic alloy for filling the gaps is lead, tin and bismuth based with a relatively low melting point.

The heat exchange can be further improved by providing inside the tubes guide means designed to make the fluid circulate according to a turbulent flow with a helicoidal trajectory when passing through the body. The fluid guide means comprise a turbulating device cooperating with fixing means for assembly of the two manifolds on the body. The fixing means are formed by screws housed in a series of apertures located in the second external face of each manifold opposite the first bearing face, said screws being in axial alignment with the recesses and corresponding tubes.

Such a cooling element structure enables ordinary water to be used in the cooling circuit. The isolation voltage of the water with respect to the component reaches 20 kV, given that the annular cavities arranged at the level of the manifolds between the ends of the tubes and the recesses are filled with a dielectric substance, notably resin-based, which is injected via holes which outlet into the recesses.

Other advantages and features will become more clearly apparent from the following description of an illustrative embodiment of the invention, given as an example only and represented in the accompanying drawings, in which.

Figure 1:
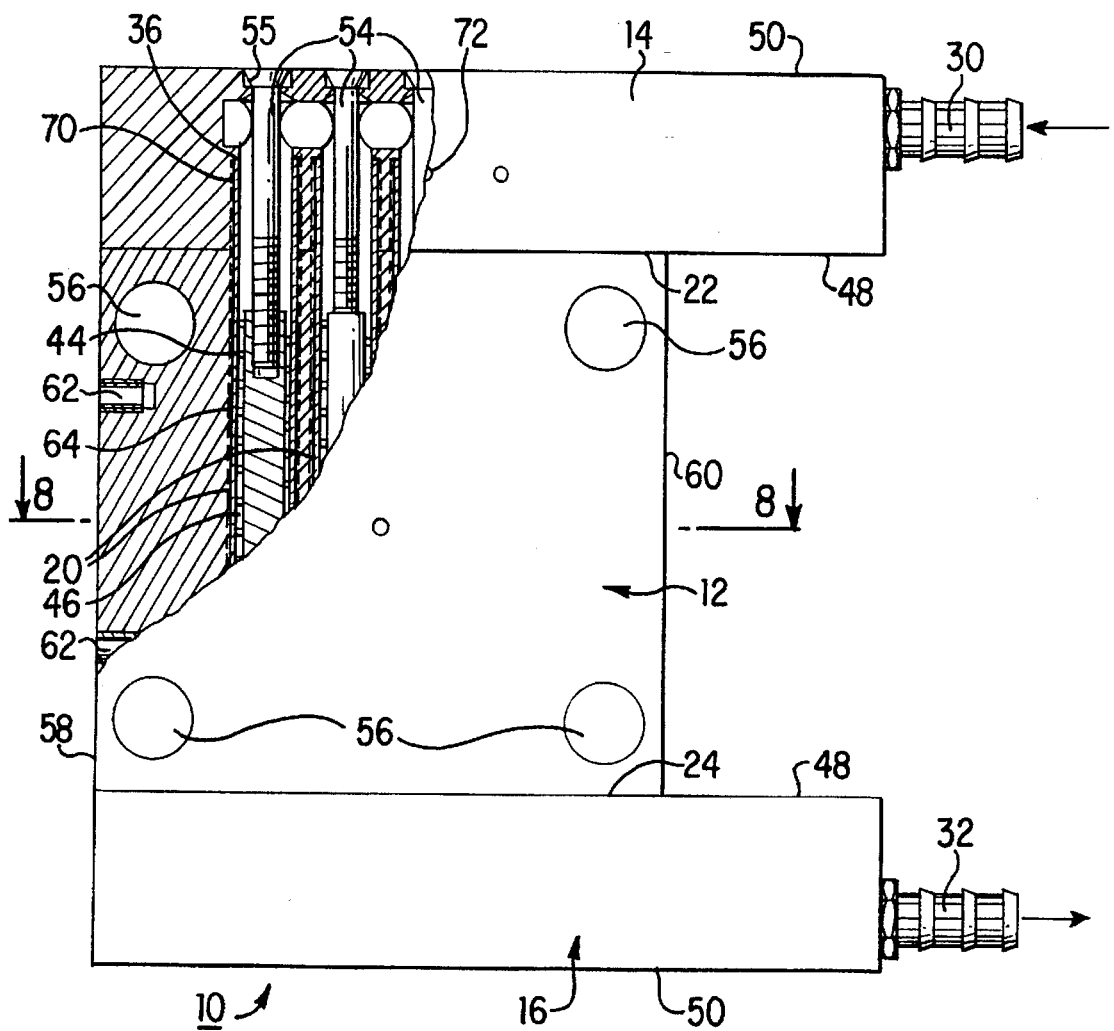
FIG. 1 is an elevational view, partially represented in cross-section of the cooling element according to the invention.
Figure 2:
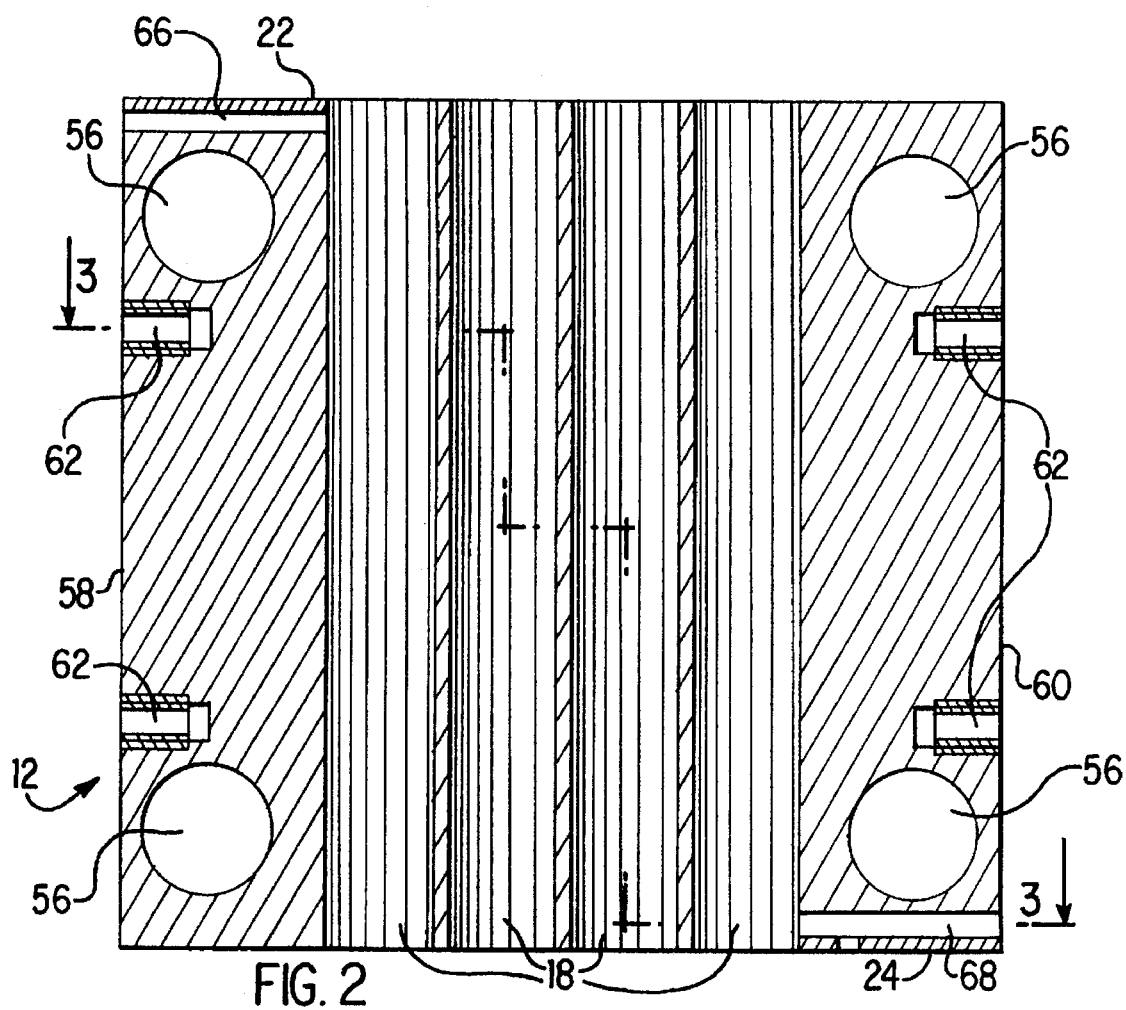
FIG. 2 shows a cross-sectional view on an enlarged scale of the body of the element of FIG. 1.
Figure 3:
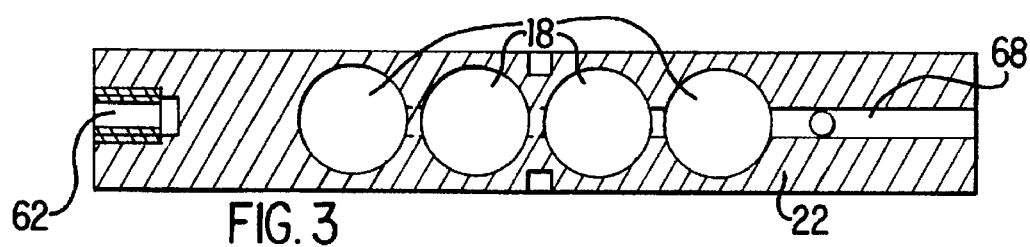
FIG. 3 represents a cross-sectional view along the broken line 3—3 of FIG. 2.
Figure 4:
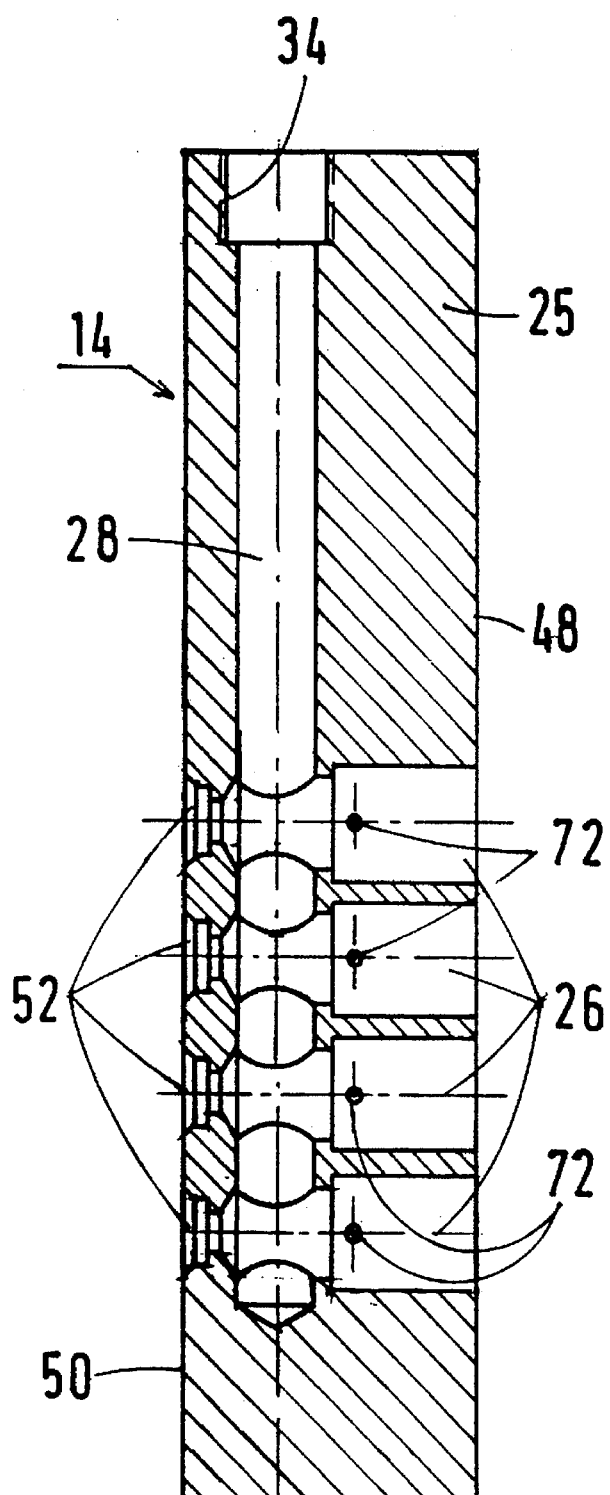
FIG. 4 shows a cross-sectional view of the inlet manifold of the cooling element of FIG. 1, the inlet nozzle not being represented.
Figure 5:
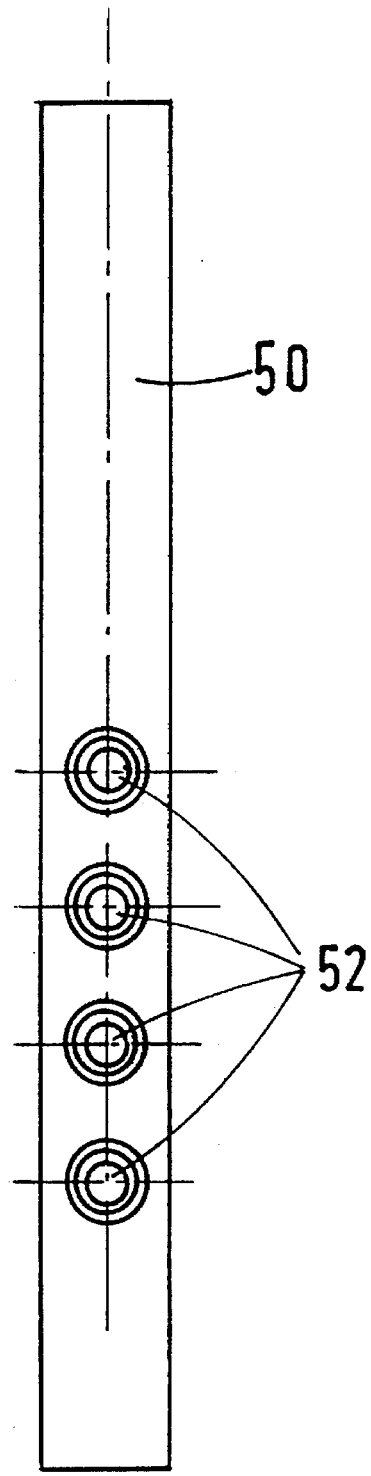
FIG. 5 is a profile view of FIG. 4.

With reference to FIGS. 1 to 7, a cooling element and connector 10 for at least one electronic component comprises a quadrangular supporting body 12 of the component, and two elongated manifolds 14, 16 on each side of the body 12 to allow circulation of a cooling fluid. The body 12 forms a heat sink made of a good heat and electricity conducting material, notably aluminium or copper, and is drilled with a series of parallel orifices 18 of circular cross-section.

Each orifice 18 has passing axially through it a tube 20 inside which the cooling liquid flows. The length of the tubes 20 is greater than that of the orifices 18, and the opposite ends of the tubes 20 protrude out from the joining faces 22, 24 of the body 12. Each tube 20 presents a slightly smaller diameter than that of the orifice 18, and is made of an isolating and good heat conducting material, for example alumina or aluminium nitride. Any other ceramic material can naturally be used.

Each cooling fluid manifold 14, 16 comprises a block 25 made of isolating material, notably moulded or machined from the mass. The block 25 is equipped with a plurality of recesses 26 receiving the ends of the tubes 20, and with a common pipe 28 extending perpendicularly to the recesses 26 and making them communicate respectively with an inlet nozzle 30 and an outlet nozzle 32. Each nozzle 30, 32 is formed by a grooved male sleeve screwed into an orifice 34 tapped at the inlet of the pipe 28 of the corresponding manifold 14, 16, and able to be connected to a fluid distribution circuit. Any other form of nozzle can naturally be used for connection, notably a nozzle moulded directly with the block 25 of the manifold 14, 16.

The internal recesses 26 of the block 25 are placed coaxially facing the orifices 18 of the body 12, and present appreciably the same diameters. A first O-ring 36 is placed at the bottom of each recess 26 to provide the leaktightness with the end of the tube 20 when assembly of the manifolds 14, 16 with the body 12 is performed.

Figure 7:
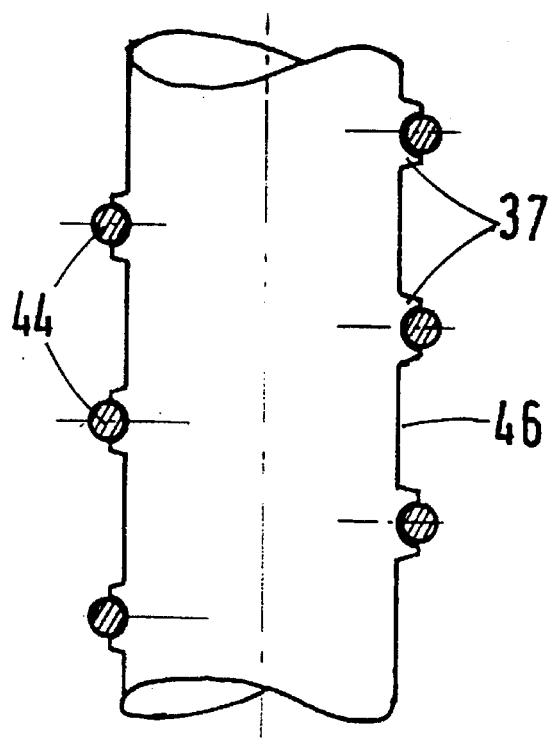
FIG. 7 is a detailed view on an enlarged scale of FIG. 6.
Figure 6:
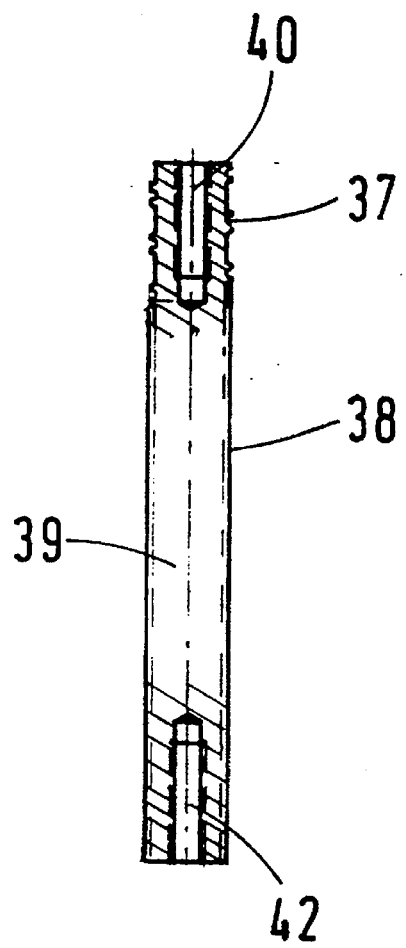
FIG. 6 is a view of the turbulating device designed to be engaged in each tube of the body of FIG. 1.
Figure 8:
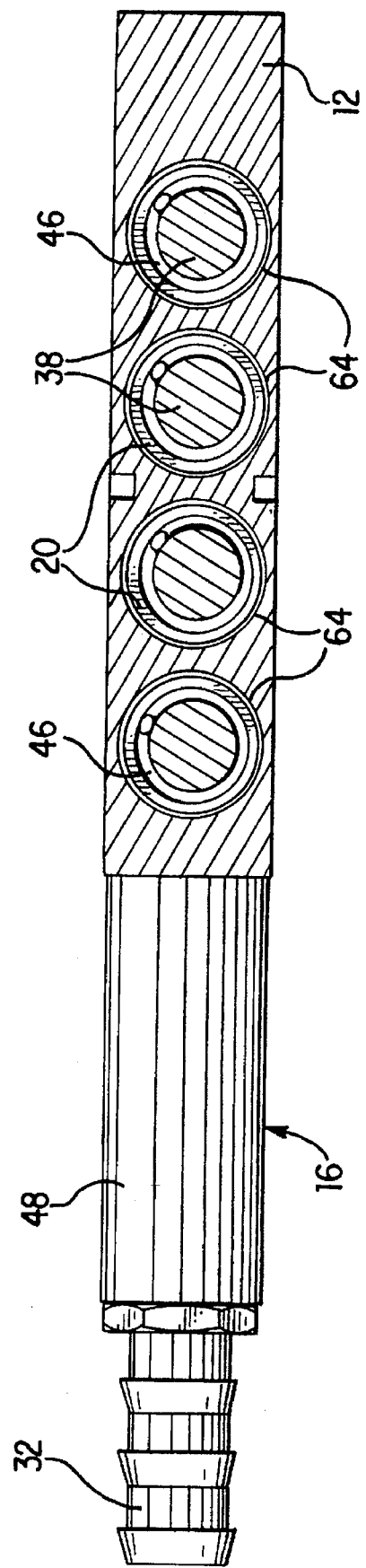
FIG. 8 is a cross-sectional view along the line 8—8 of FIG. 1.

Inside each isolating tube 20 there are located guide means designed to make the fluid circulate according to a turbulent flow of helicoidal trajectory when passing through the body 12. An example of an embodiment of these guide means is represented in FIGS. 6 and 7, illustrating a turbulating device 38 formed by an aluminium strip 39 comprising a spiral groove 37 along the cylindrical lateral surface. The opposite ends of each strip 39 are provided with tapped blind holes 40, 42, and a sealing wire 44, notably rubber-based, is housed in the groove 37 so as to come into engagement with the internal surface of each tube 20. The cooling fluid flow in the body 12 takes place in a plurality of spiral canals 46 situated between the strip 39 and the internal surface of each tube 20. This results in a high-speed turbulent flow which enables an optimum heat exchange to be obtained.

The choice of the diameter of the strip 39 and/or of the pitch of the spiral groove 37 enables the pressure drop and the flowrate inside the body 12 to be adjusted according to the parameters of the installation.

The recesses 26 of each manifold 14, 16 outlet on the same side as the first flat bearing surface 48 designed to be adjoined with the conjugate joining face 22, 24 of the body 12. Opposite the first bearing surface 48, a second external face 50 extends in parallel, comprising a series of apertures 52 for the passage of fixing means formed by screws 54.

The apertures 52 of each manifold 14, 16 are located in axial alignment with the recesses 26 and the corresponding tubes 20, so as to enable the screws 54 to be inserted in the holes 40, 42 arranged on the front faces of the turbulating devices 38. Tightening of the set of screws 54 ensures efficient securing of the two manifolds 14, 16 on the central body 12. A second O-ring 55 is inserted in each aperture 52 for the purposes of leaktightness under the head of the screw 54.

At the four corners of the body 12 there can be located circular holes 56 extending orthogonally to the orifices 18 and allowing assembly means to pass when several cooling elements 10 are stacked. The other two opposite faces 58, 60 of the body 12 which are not in contact with the manifolds 14, 16 are provided with connecting means 62 for electrical connection of the component.

For the heat exchange between the cooling fluid and the body 12 to be the best as possible, the annular gaps 64 arranged between the external surface of the tubes 20 and the lateral surface of the orifices 18 are filled by means of a metallic alloy with a low melting point, notably lead, tin and bismuth based. The body 12 comprises for this purpose two filling orifices 66, 68 accessible from each side face 58, 60 and communicating via the different gaps 64.

The process for implementing the cooling element 10 according to the invention is performed in the following manner:

After the tubes 20 have been fitted in the body 12, the assembly is placed in a mould and subjected to a first heating operation at a predetermined temperature. After a second operation consisting in creating a vacuum in the mould, the melted alloy is injected into the mould via the downstream filling orifice 68 until all the annular gaps 64 have been totally filled.

At the end of this third vacuum casting operation, progressive cooling of the metal of the metallic alloy causes an expansion effect of the metal so as to prevent any thermal contact resistance with the wall of the body 12 over the whole length of the orifices 18. The cooled alloy remains sufficiently soft to allow differential dilatations when temperature variations of the body 12 occur.

The body 12 equipped with its tubes 20 is then removed from the mould, and the fourth assembly operation can then begin. The turbulating devices 38 are engaged in the tubes 20, followed by adjoinment of the two isolating manifolds 14, 16 against the joining faces 22, 24 of the body 12, with insertion of the ends of the tubes 20 in the corresponding recesses 26. Final assembly is then performed by tightening of the screws 54 in the tapped holes 40, 42 of the strips 39.

In the course of a last operation, the annular cavities 70 arranged at the level of the manifolds 14, 16 between the ends of the tubes 20 and the recesses 26 are filled with a resin-based dielectric substance, injected via holes 72 which outlet into the recesses 26. Total filling of these cavities 70 by the resin strengthens the dielectric withstand between the cooling circuit and the metal body 12.

Ordinary water (with or without antifreeze) can be used in the cooling circuit, and the isolation voltage with respect to the component can reach 20 kV. Any other cooling fluid can naturally be used, in a distribution circuit under pressure or with a circulator.

According to an alternative embodiment, the turbulating devices 38 can be obtained by moulding of a plastic material, with sufficiently flexible sealing lips replacing the wire 44.

We claim:

1. A cooling element and connector comprising a body made of a good heat and electricity conducting metallic material, and forming a heat sink through which a cooling fluid flows, said body having a support face of an electronic power component constituting the heat source, and comprising:

a plurality of orifices through which fluid circulation tubes pass axially, each tube having a diameter slightly smaller than that of the orifice, and being made of an electrical insulating and good heat conducting material, an annular gap arranged between each tube and the corresponding orifice, said gap being filled with a metallic alloy enabling an optimum heat exchange between the heat source and the cooling fluid, insertion of the alloy being performed via a filling orifice arranged in the body.

2. The cooling element according to claim 1, wherein the fluid circulation tubes are connected by a pair of manifolds adjoined to the opposite joining faces of The body, each manifold being made of an insulating material.

3. The cooling element according to claim 2, wherein each manifold is equipped along the first flat bearing face with a plurality of recesses to receive the opposite ends of the tubes, and with a common pipe making the tubes communicate respectively with an inlet nozzle and an outlet nozzle associated to a fluid distribution circuit.

4. The cooling element according to claim 1, wherein each tube has a length greater than that of the associated orifice, and the material of the tube is made of ceramic, notably alumina or aluminium nitride.

5. The cooling element according to claim 1, wherein the metallic alloy for filling the gaps is lead, tin and bismuth based having a relatively low melting point, and filling is performed by means of a vacuum casting operation.

6. The cooling element according to claim 1, wherein each isolating tube contains guide means designed to make the fluid circulate in the body according to a turbulent flow, with a helicoidal trajectory.

7. The cooling element according to claim 6, wherein:
the fluid guide means comprise a turbulating device cooperating with fixing means for assembly of the two manifolds on the body,
and the fixing means are formed by screws housed in a series of apertures located in the second external face of each manifold opposite the first bearing face, said screws being in axial alignment with the recesses and corresponding tubes.

8. The cooling element according to claim 7, wherein the turbulating device comprises a metallic strip having a spiral groove along the cylindrical lateral surface, and a sealing wire housed in the groove, and said sealing wire comes into engagement with the internal surface of the tube so as to form a spiral canal in which the cooling fluid flows at high speed.

9. The cooling element according to claim 8, wherein:
the strip is provided at the opposite ends with two tapped blind holes, designed for screwing a pair of screws passing through the opposite ends of the associated tube,
a first seal is placed at the bottom of the recesses of each manifold to provide the leak tightness with the opposite ends of the tubes,
and a second seal is inserted into each aperture to provide the leak tightness under the head of the screws.

10. The cooling element according to claim 3, wherein the cooling fluid is water, and the annular cavities arranged at the level of the manifolds between the ends of the tubes and the recesses are filled with a resin based dielectric substance, which is injected via holes which outlet into the recesses.

* * * * *